(12) United States Patent
Hinterscher (10) Patent No.: US 6,313,678 B1
(45) Date of Patent: Nov. 6, 2001

(54) SINGLE-PIN EXTERNALLY CONTROLLED EDGE RATE CONTROLLER CIRCUIT

(75) Inventor: Gene B. Hinterscher, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/662,676

(22) Filed: Sep. 15, 2000

Related U.S. Application Data

(60) Provisional application No. 60/159,119, filed on Oct. 13, 1999.

(51) Int. Cl.[7] .................................................. H03B 21/00
(52) U.S. Cl. ........................................... 327/170; 327/108
(58) Field of Search .................................... 327/170, 437, 327/108; 326/27, 26

(56) References Cited

U.S. PATENT DOCUMENTS 5,138,194 * 8/1992 Yoeli ..................................... 327/170
5,557,223 * 9/1996 Kuo ...................................... 327/170

* cited by examiner

Primary Examiner—Dinh T. Le
(74) Attorney, Agent, or Firm—Alan K. Stewart; Wade James Brady, III; Frederick J. Telecky, Jr.

(57) ABSTRACT

The edge rate controller circuit includes: a first transistor coupled to an output control node; a second transistor coupled to the output control node; an edge rate control driver; a third transistor coupled to the first transistor; a fourth transistor coupled in parallel with the third transistor, the fourth transistor having a control node coupled to the edge rate control driver; a fifth transistor coupled to the second transistor; and a sixth transistor coupled in parallel with the fifth transistor, the sixth transistor having a control node coupled to the edge rate control driver.

5 Claims, 5 Drawing Sheets

SINGLE-PIN EXTERNALLY CONTROLLED EDGE RATE CONTROLLER CIRCUIT

This application claims priority under 35 USC §119 (e)(1) of provisional application No. 60/159,119 filed Oct. 13, 1999.

FIELD OF THE INVENTION

This invention relates to voltage waveform slew rate control, commonly referred to as edge rate control, and in the preferred embodiment, to the adjustment of pulse rise and fall times for various conditions of backplane loading and operating temperature, implemented in a complementary metal oxide semiconductor (CMOS) device.

BACKGROUND OF THE INVENTION

The backplane assembly of a high speed data processing and transmission system is a primary source of potentially unacceptable electronic noise and electromagnetic interference (EMI). This may involve signals in the frequency range of 150–175 Mhz but is not necessarily confined to this frequency range. The presence of noise and/or EMI can render a high speed data system functionally inoperative by causing misinterpretation of data bits by the inclusive circuitry, resulting in high bit-error-rates or system lock-up. Another detrimental effect of system noise is to cause unwanted fluctuations in the circuit supply voltage. This is particularly undesirable when the device comprises Gunning Transceiver Logic (GTL) because a lower supply voltage, 1.2–1.5 volts vs 3.3 volts, is implemented to achieve higher processing speeds.

The backplane noise is directly proportional to the rate of change of current flowing in the backplane circuit paths with respect to time, and to the inductance of these circuit paths, or $L*(di/dt)$. This change in current flow is inherent in digital circuits due to the amplitude change of pulse waveforms with time. Specific pulse waveform characteristics that must be focused on in order to minimize or eliminate this system noise are the pulse rise and fall times, which determine the pulse edge rate or slew rate. Further, it is desired to provide the capability to increase the rise and fall times, thereby reducing the edge rate, in order to reduce the magnitude of di/dt. It is also desired to allow faster edge rates when system noise is not a prevalent problem or can otherwise be tolerated, an example of which would be a data transmission system operating in a lower frequency range than is applicable here.

The inductance of the circuit paths is a fixed physical parameter that is derived from backplane interconnections, such as printed wiring board (PWB) connectors, and interconnect wiring within the semiconductor devices. Such inductance is minimized in the backplane and device layout design process, leaving edge rate control as the primary means of alleviating system noise.

There currently exist several techniques for reducing system noise through use of edge rate control. Representative examples are given below with appropriate references:

Edge rate feedback CMOS output buffer circuit, U.S. Pat. No: 5,121,000. This invention includes an output driver stage that is formed of a pull-up transistor, a pull-down transistor, and feedback means. The feedback means is responsive to the output signal for controlling the rate of rise of the voltage at the gate electrode of the pull-down transistor so as to slow down its turn-on time when the output terminal is making a high-to-low transition, thereby reducing the ground bounce. The feedback means is preferably formed of a capacitor having a first plate connected to the output terminal and a second plate connected to the gate electrode of the pull-down transistor.

Controlled slew rate buffer, U.S. Pat. No. 5,138,194. This invention comprises a driver receiving voltage along a voltage supply line and includes feedback apparatus which senses the voltage supply line and slows the speed of the buffer when the noise level passes a given threshold.

CMOS driver having reduced switching noise, U.S. Pat. No. 5,241,221. This invention is comprised of a driver circuit with high- and low-impedance drive means which operate in parallel to effect a desired output transition. Adaptive control means respond to a threshold value of the output signal and turn off the low-impedance drive means in the course of the output transition. The low initial output impedance of the driver circuit effects rapid charging of a line capacitance, while toward the end of the output transition the higher output impedance of the driver circuit more closely matches the input impedance of a load circuit. This higher impedance dampens ringing and thereby reduces induced supply line noise.

CMOS buffer with controlled slew rate, U.S. Pat. No. 5,619,147. In this invention a feedback path from the output is coupled to transistors comprising a differential pair; the transistors are further coupled to a capacitance. The discharge rate of the capacitance and the size choices of the transistors in the circuit are used with the feedback means to control the high-to-low and low-to-high transition rate of the output.

Slew Rate Controlled CMOS TIA/EIA-485 Transceiver, DS36C280, and RS423 Programmable Slew Rate Line Driver, DS9636A, National Semiconductor Corp. devices, have provisions for connecting an external resistor by the user, the value of which determines the rise and fall times of the output waveform.

SUMMARY OF THE INVENTION

An embodiment of the invention will be disclosed in the context of its use in a semiconductor device known as a data bus transceiver, comprised of Gunning Transceiver Logic (GTL), for use in backplanes utilized in high speed data communications. This invention provides the means to adjust the rise and fall times of the output waveform, or edge rate, by adjusting the voltage on a single external pin provided on the transceiver for that specific purpose. The current art does not include an edge rate control means that utilizes an external single-pin means for adjusting and controlling waveform edge rate by application of a single control voltage by the, user at the said external pin.

Further, the detailed description of the invention will show that upon application of a voltage such as VDD, which is the primary supply voltage for the bus transceiver, at the aforementioned external pin the rise and fall times of the transceiver output voltage waveform are increased significantly, causing a corresponding decrease in instantaneous circuit current, or di/dt, for the specific purpose of reducing system noise. The detailed description will also show that upon application of a lower voltage such as ground potential at the external pin the rise and fall times of the transceiver output voltage waveform are decreased significantly, for the specific purpose of allowing faster edge rates when desired by the user.

The detailed description will further show that the edge rate control circuitry of the invention utilizes two signals that originate elsewhere in the transceiver, said signals not being related to the invention. These signals are output from another transceiver circuit and change with variations in backplane process, backplane temperature, and VDD.

It will still further be shown that application of VDD at the aforementioned external pin of the transceiver causes an increase in the effective resistivity of the final drive path for the output voltage waveform, thereby reducing the drive strength to the final output transistor of the transceiver. A reduced drive strength to the output transistor causes the rise and fall times of the transceiver output voltage waveform to be significantly increased, thereby achieving a slower edge rate. It will also be shown that application of ground potential to this same external pin of the transceiver causes a decrease in the effective resistivity of the final drive path for the output waveform, thereby increasing the drive strength to the final output transistor of the transceiver. An increase in drive strength to the output transistor causes the rise and fall times of the transceiver output voltage waveform to be significantly decreased, thereby achieving a faster edge rate.

The detailed description will further show that the invention incorporates the capability to place the transceiver output in a high-output impedance state, or tristate mode, whenever necessary for proper transceiver operation or to prevent damage to the transceiver device.

The invention will best be understood from the claims when read in conjunction with the detailed description and drawings herein.

Common reference designators are used in the drawings and replicated wherever necessary for purposes of clarity.

DETAILED DESCRIPTION OF THE PREFERRED EMBODIMENT

Figure 1:
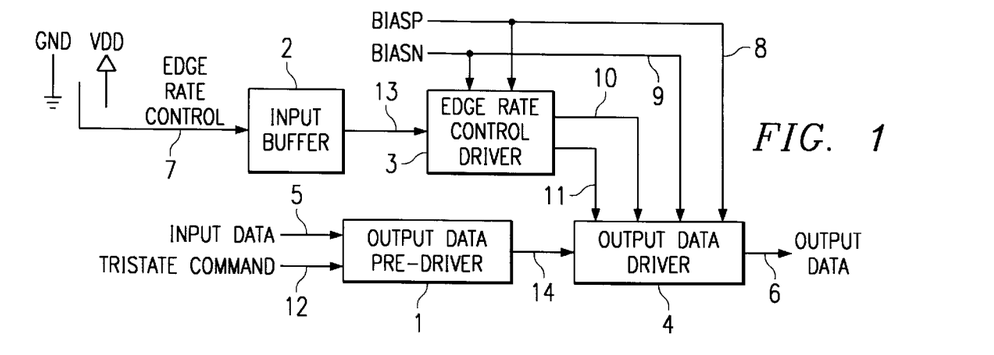
FIG. 1 is a block diagram of that part of the transceiver comprising the invention. Each functional block is numbered for reference purposes to be used in partial schematics.

FIG. 1 shows that part of the data bus transceiver comprising the invention in block diagram form. Signal input data 5, which originates elsewhere in the transceiver, is input to the output data pre driver 1 and is the primary data stream that becomes signal output data 6 with controlled edge rates from the output data driver 4. Signal edge rate control 7 is input to the input buffer 2 by connecting the external pin of the transceiver to VDD or ground, resulting in a slow or fast output voltage waveform edge rate, respectively. Selection of VDD or ground is at the discretion of the transceiver user; the degree of edge rate control achievable with the invention will be presented later in this discussion. The use of voltages other than VDD and ground potential for signal edge rate control 7 is also within the scope of this invention.

Signals biasp 8 and biasn 9 also originate elsewhere within the transceiver and are input to the edge rate control driver 3, in addition to the output signal from the input buffer 1 on signal line 13. Signals biasp 8 and biasn 9 will be characterized in detail later in this discussion. Output signals 10 and 11 from the edge rate control driver 3 are input to the output data driver 4, in addition to signals biasp 8 and biasn 9, to control the edge rate of signal output data 6.

Signal tristate command 12 also originates elsewhere in the transceiver and is input to the output data pre-driver 1 and will, when enabled, place output data driver 4 in a high output impedance state.

Figure 2:
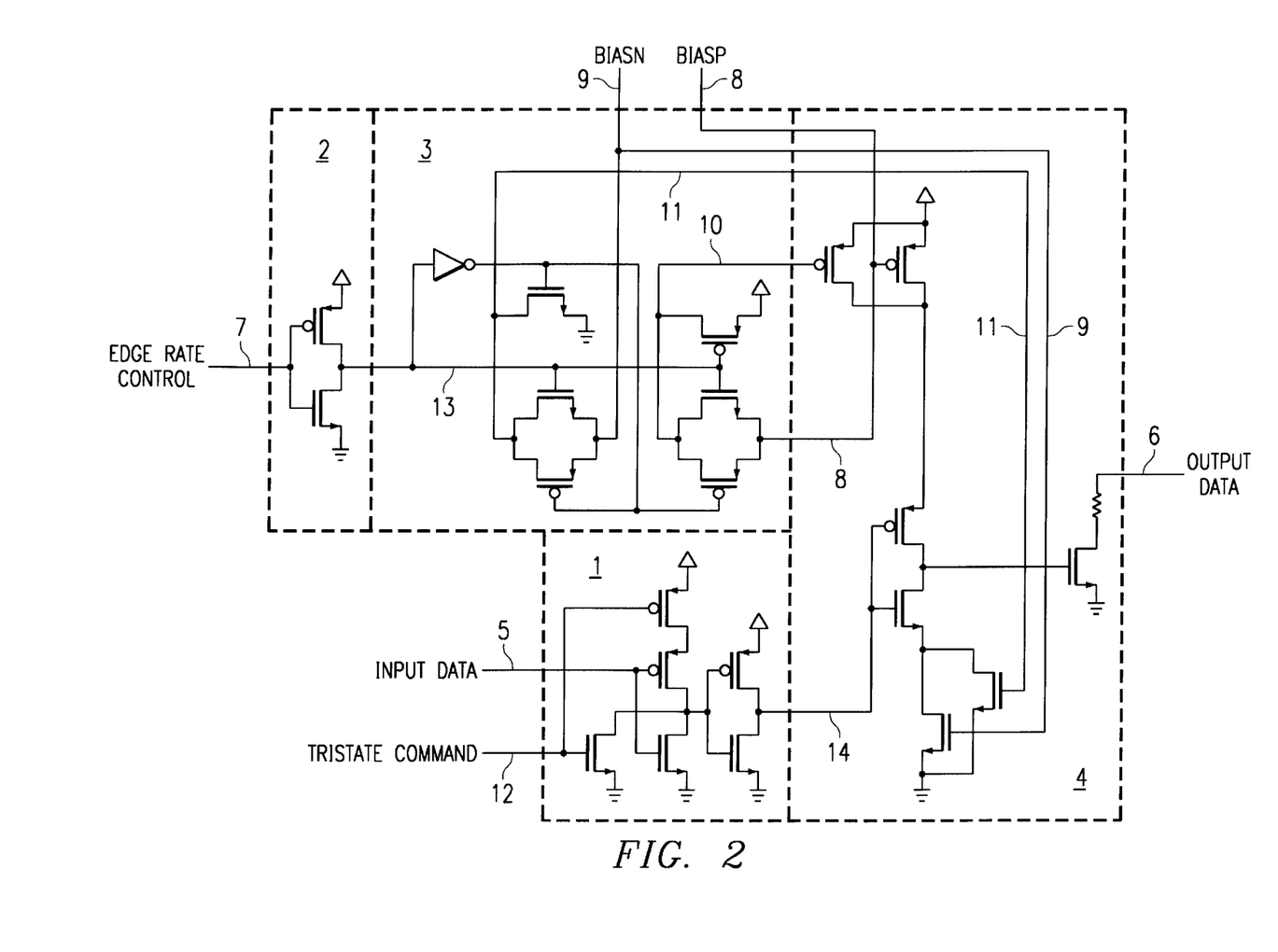
FIG. 2 is the complete schematic diagram of the invention.

FIG. 2 shows the schematic of the invention in its entirety for reference only. The detailed description of circuit operation will be given utilizing the partial schematics of FIGS. 3,4, and 5.

Figure 3:
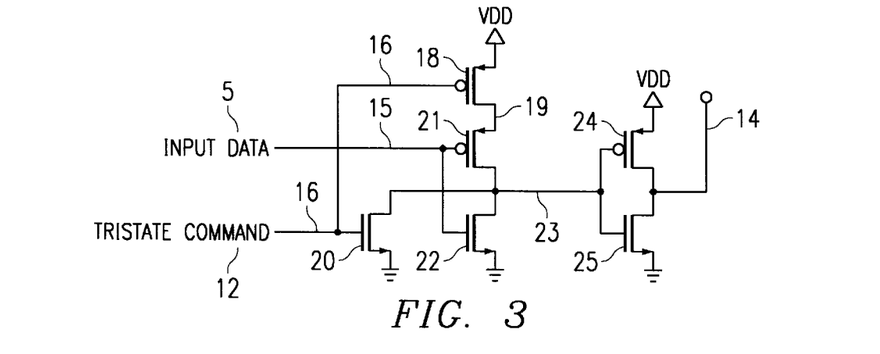
FIG. 3 is a partial schematic showing the Output Data Pre-Driver block of this invention.

The detailed description of circuit operation for output data pre-driver 1, shown in FIG. 3, will be presented in the context of three operating conditions: signal input data 5 high and signal tristate command 12 low; signal input data 5 low and signal tristate command 12 low; signal tristate command 12 high and signal input data 5 high or low.

The first set of operating conditions to be considered for the output data pre-driver 1 circuit will be that of signal input data 5 being high and signal tristate command 12 being low causing signal line 16 to be low and signal line 15 to be high. With signal line 16 being low gate 18 will be in a conductive state and transistor 20 will be in an off state. Signal line 15 being high places transistor 21 in an off state and transistor 22 in a conductive state. With transistor 22 conducting signal line 23 approaches ground potential thereby placing transistor 25 in an off state and transistor 24 in a conductive state. This causes signal line 14 to approach VDD potential, by virtue of transistor 24 being on and transistor 25 being off, applying a logic high signal to the input of said output data driver 4.

The second set of operating conditions to be considered for output data pre-driver 1 in FIG. 3 are with signal input data 5 being low and signal tristate command also being low, or disabled. Summarizing from the schematic of FIG. 3, signal lines 15 and 16 will be low, placing transistor 20 and 22 in the off state, and transistors 18 and 19 in the on state, causing signal line 23 to approach VDD potential. This places transistor 24 in the off state and transistor 25 in the conductive state, causing signal line 14 to approach ground potential, thereby applying a logic low input signal to said output data driver 4.

The third and final set of operating conditions for output data pre-driver 1 in FIG. 3 will be with signal tristate command 12 at a logic level high, or enabled, the state of signal input data 5, it will be shown, is inconsequential to circuit operation when signal tristate command 12 is enabled. With signal tristate command high transistor 18 is placed into an off state and transistor 20 is placed in a conductive state, causing signal line 23 to approach ground potential. Assuming here that signal input data 5 is high, transistor 21 will be in an off state and transistor 22 in a conductive state, also resulting in signal line 231 being near ground potential. Conversely, were signal input data 5 to be low, transistor 21 would nevertheless remain in the off state by virtue of transistor 18 being off and thereby depriving transistor 21 of source voltage VDD, maintaining still signal line 23 near ground potential. As was shown previously, signal line 23 being near ground, potential results in signal line 14 being near VDID potential, thus applying a logic high signal to the input of said output data driver 4. It can therefore be concluded that when signal tristate command is high, or enabled, signal line 14 will go to and remain near VDID potential regardless of the logic level of signal input data 5.

Figure 4:
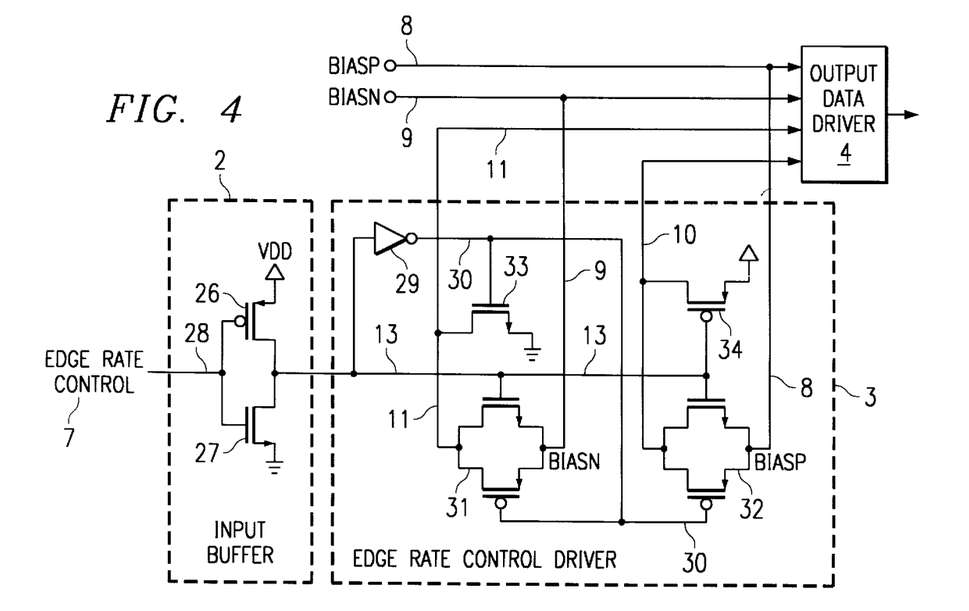
FIG. 4 is a partial schematic showing the Input Buffer and Edge Rate Control Driver blocks of this invention.

The detailed description of input buffer 2 and edge rate control driver 3, both shown in the partial schematic of FIG. 4, will be presented in combination. As stated previously, signal edge rate control 7 is selected by the user for fast or slow edge rates, and may be one of ground or VDD potential, via an external pin provided on the bus transceiver device. The detailed description will include circuit operation for each possible selection.

The first operating condition to be considered for the circuit of FIG. 4 will be with input signal edge rate control 7 selected to be at ground potential. This causes signal line 28 to be near ground potential, placing transistor 27 in an off state and transistor 26 in a conductive state, thereby causing signal line 13 to approach VDD potential and signal line 30 to approach ground potential via inverter 29. Under these described conditions transmission gates 31 and 32 are placed in a conductive, or enabled, state, allowing input signals biasp 8 and biasn 9 to pass through to signal lines 10 and 11, respectively, as input signals to output data driver 4. Under these same described conditions transistors 33 and 34 are each placed in an off state, exerting no influence on signal lines 10 and 11.

The second and final operating condition to be considered for the circuit of FIG. 4 will be with input signal edge rate control 7 selected to be at VDD potential. This causes signal line 28 to be near VDD potential, placing gate 27 in a conductive state and transistor 26 in an off state, thereby causing signal Line 13 to approach ground potential and signal line 30 to approach VDD via inverter 29. Under these described conditions transmission gates 31 and 32 are placed in an off state, or disabled. Transistor 33 is placed in a conductive state by virtue of signal line 30 being near VDD potential, causing signal line 11 to approach ground potential. Transistor 34 is likewise placed in a conductive state by virtue of signal line 13 being near ground potential, causing signal line 10 to approach VDD potential.

To summarize the operation of the circuit shown in FIG. 4, selection by the user of input signal edge rate control 7 to be at ground potential results in input signals biasp 8 and biasn 9 to be provided as input signals 10 and 11, respectively, to output data driver 4. Further, selection by the user of input signal edge rate control 7 to be at VDD potential results in signal line 10 being near VDD potential and signal line 11 being near ground potential, as inputs to output data driver 4. It will be shown in the detailed description of said output data driver 4 that signal lines 10 and 11 directly determine the edge rates for signal output data 6.

Figure 5:
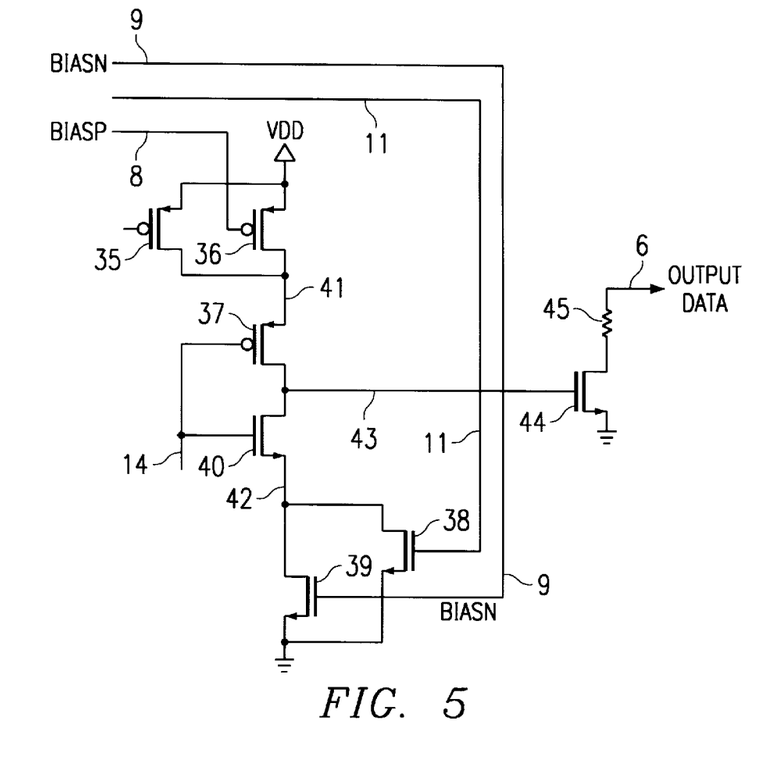
FIG. 5 is a partial schematic showing the Output Data Driver block of this invention.

It is necessary at this point to characterize input signals biasp 8 and biasn 9 before proceeding to the detailed description of the output data driver 4 shown in FIG. 5.

As stated previously input signals biasp 8 and biasn 9 originate elsewhere in the bus transceiver device. These signals will vary in magnitude with variations in backplane temperature and VDD, providing an appropriate gate drive signal to the applicable transistors to which they are input.

Specifically, input signal biasp 8 will approach VDD potential at low temperature, −40 deg C. for example, providing a reduced gate drive to P-channel transistors. At high temperature, +85 deg C. for example, biasp 8 is lower in magnitude than that for a low temperature, providing a stronger gate drive to P-channel transistors. Also, a VDD source voltage higher than its nominal value causes biasp 8 to approach VDD to provide reduced gate drive to P-channel transistors. A decrease in VDD below its nominal value causes biasp 8 to decrease in magnitude to provide stronger gate drive to P-channel transistors.

Specifically, input signal biasn 9 will approach ground potential at low temperature, providing reduced gate drive to N-channel transistors. At high temperature biasn 9 is higher in magnitude that for a low temperature, providing a stronger gate drive to N-channel transistors. Also a VDD source voltage higher than its nominal value causes biasn 9 to approach ground potential to provide reduced gate drive to N-channel transistors. A decrease in VDD below its nominal value causes biasn 9 to increase in magnitude to provide stronger gate drive to N-channel transistors.

The specific purpose for input signals biasp 8 and biasn 9 in the bus transceiver is to adjust the rise and fall times of the signal output data 6 waveform, according to variations in backplane temperature and VDD, by adjusting the gate drive to the appropriate transistors in output data driver 4, as can be seen in the partial schematic of FIG. 5. The invention comprises a means of utilizing input signals biasp 8 and biasn 9 to further adjust these rise and fall times through selection by the user of the value for input signal edge rate control 7 at an external pin of the transceiver.

In the detailed description of circuit operation for output data driver 4 it will be shown that for selection of input signal edge rate control 7 to be at ground potential an increased drive strength is caused within output data driver 4 for the purpose of reducing the rise and fall times of the signal output data 6 waveform. It will also be shown that for selection of input, signal edge rate control 7 to be at VDD potential there is no increase in drive strength caused within output data driver 4, resulting in input signals biasp 8 and biasn 9 alone controlling the rise and fall times of signal output data 6.

The detailed description of circuit operation for output data driver 4, shown in FIG. 5, will be in the context of three operating conditions: input signal edge rate control 7 selected by the user to be at ground potential and input signal tristate command 12 low, or disabled; input signal edge rate control 7 selected by the user to be at VDD potential and input signal tristate command 12 low, or disabled; input signal tristate command 12 high, or enabled, and input signal edge rate control 7 at ground and VDD potential. In each of the said operating conditions input signals biasp 8 and biasn 9 will be assumed to be at a nominal or midpoint value, placing the gates to which they are input as gate drivers into conductive states. This assumption is valid since the exact magnitude of these signals do not influence the embodiment of the invention.

The first set of operating conditions to be considered for the detailed description of output, data driver 4 will be with input signal edge rate control 7 selected to be at ground potential and input signal tristate command 12 low, or disabled. For these conditions signal line 10 is at a level equal to input signal biasp 8 as was shown in the discussion for edge rate control driver 3. This places transistor 35 in a conductive state in parallel with transistor 36, which is also in a conductive state due to input signal biasp 8 as gate drive. The parallel conductive states of transistors 35 and 36 reduces the effective resistivity between VDD and gate 37, via signal line 41, resulting in a higher source voltage for gate 37 than would be the case if only transistor 36 was conducting.

Simultaneous with the above, signal line 11 is at a level equal to input signal biasn 9 as was shown in the discussion for edge rate control driver 3. This places transistor 38 in a conductive state in parallel with transistor 39, which is also in a conductive state due to input signal biasn 9 as gate drive. The parallel conductive states of transistors 38 and 39 reduces the effective resistivity between ground and gate 40, via signal line 42, resulting in an increased drain for transistor 40 than would be the case if only transistor 39 was conducting.

The effect of increased source voltage to transistor 37 and increased drain for transistor 40, as described above, is to provide increased drive potential for the input signal on signal line 14 that is output from output data pre-driver 1. This will result in reduced transition times of a pulse waveform changing from low-to-high or high-to-low logic levels, thereby decreasing the waveform edge rate.

When signal line 14 is at logic level high transistor 37 has reduced gate drive and transistor 40 has increased gate drive, causing signal line 43 to approach ground potential. This results in reduced gate drive to transistor 44, the circuit's output pull-up transistor, causing signal output data 6 to go to logic level high. Conversely, when signal line 14 is at logic level low transistor 37 has increased gate drive and transistor 40 has reduced gate drive, causing signal line 43 to approach VDD potential. This results in increased gate drive to transistor 44, increasing the voltage drop across resistor 45, causing signal output data 6 to go to logic level low.

The second set of operating conditions to be considered for the detailed description of output data driver 4 will be with input signal edge rate control 7 selected to be at VDD potential and input signal tristate command 12 low, or disabled, For these conditions signal line 10 is near VDD potential and signal line 11 is near ground potential, as was shown previously in the discussion for edge rate control driver 3. Signal line 10 being near VDD potential places transistor 35 in the off state, and signal line 11 being near ground potential places transistor 38 also in the off state, leaving just transistors 36 and 39 in the conductive state due to the presence of input signals biasp 8 and biasn 9, respectively. This results in the drive potential for the input signal on signal line 14 being only that provided by input signals biasp 8 and biasn 9 through transistors 36 and 39. Logic level changes on signal line 14 result in the same changes in signal output data 6 as described above. This will result in increased transition times of a pulse waveform changing from low-to-high or high-to-low logic levels, thereby increasing the waveform edge rate.

The third and final set of operating conditions to be considered for output data driver 4 will be with input signal tristate command high, or enabled. As was shown in the discussion for output data pre-driver 1, signal line 14 is at logic level high when input signal tristate command is high, ultimately placing output pull-up transistor 44 in the off or high output impedance state. As can be seen from the schematic of FIG. 5, any changes in other input signals to output data driver 4 will not change the off state of transistor 44 if signal line 14 is held high.

Figure 6:
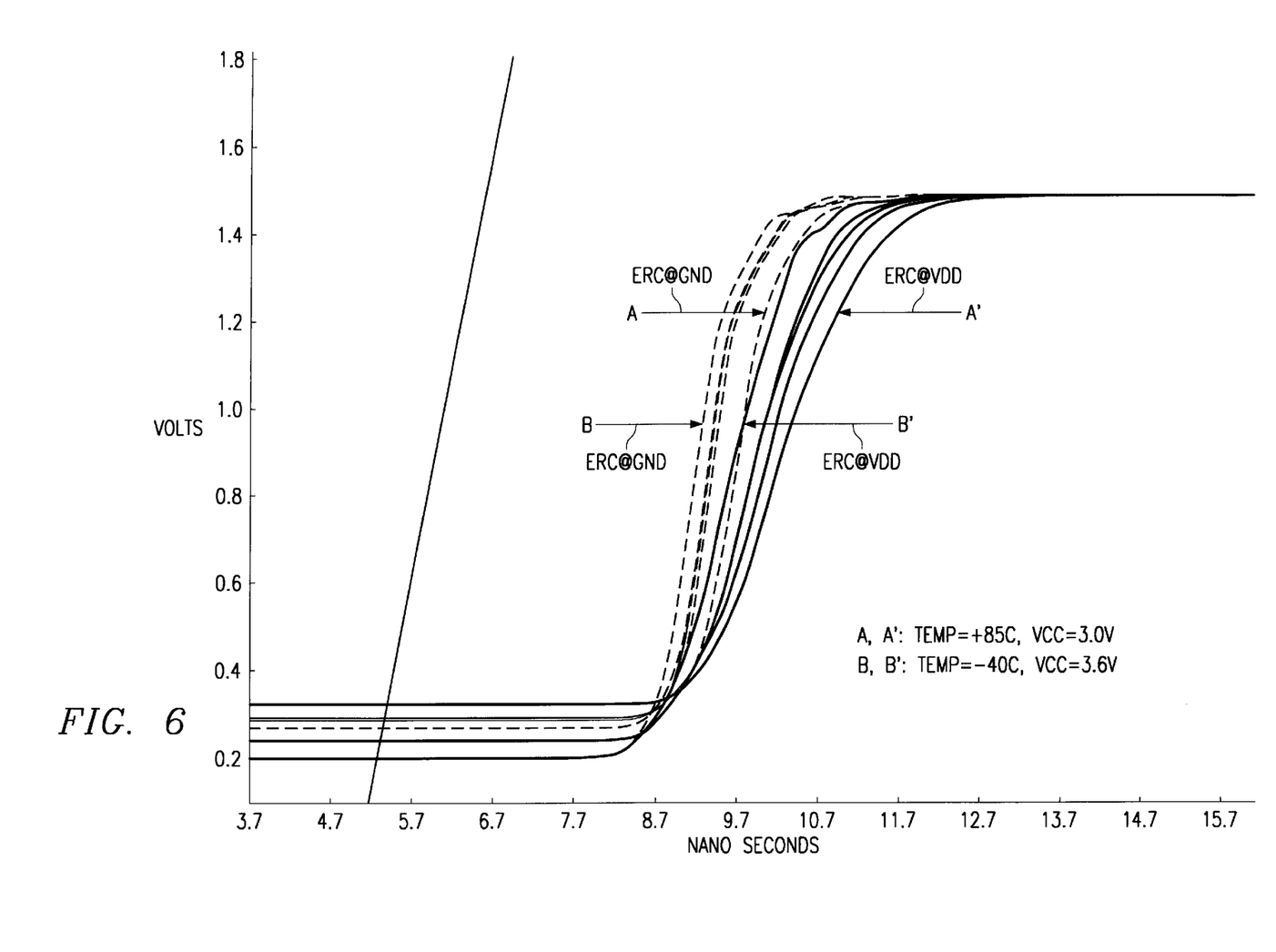
FIG. 6 shows comparative transceiver output data waveform rise times when the external pin is connected to ground and VDD.

FIG. 6 shows comparative rise times of the waveform of signal output data 6 for two conditions of backplane temperature and supply voltage VCC from which VDD is derived for GTL logic circuitry. Waveforms A and A' are for signal edge rate control (ERC) 7 selected to be at ground potential and VDD, respectively, for a backplane temperature of +85 deg C. and VCC equal to 3.0 volts. Waveforms B and B' are also for signal edge rate control 7 selected to be at around potential and VDD, respectively, but for a backplane temperature of −40 deg C. and VCC equal to 3.6 volts. The conditions of backplane temperature and VCC cited here were chosen to illustrate the degree of edge rate control achievable with the invention when signal drive strength, which determines rise and fall times, is at both minimum and maximum levels for CMOS circuitry.

Figure 7:
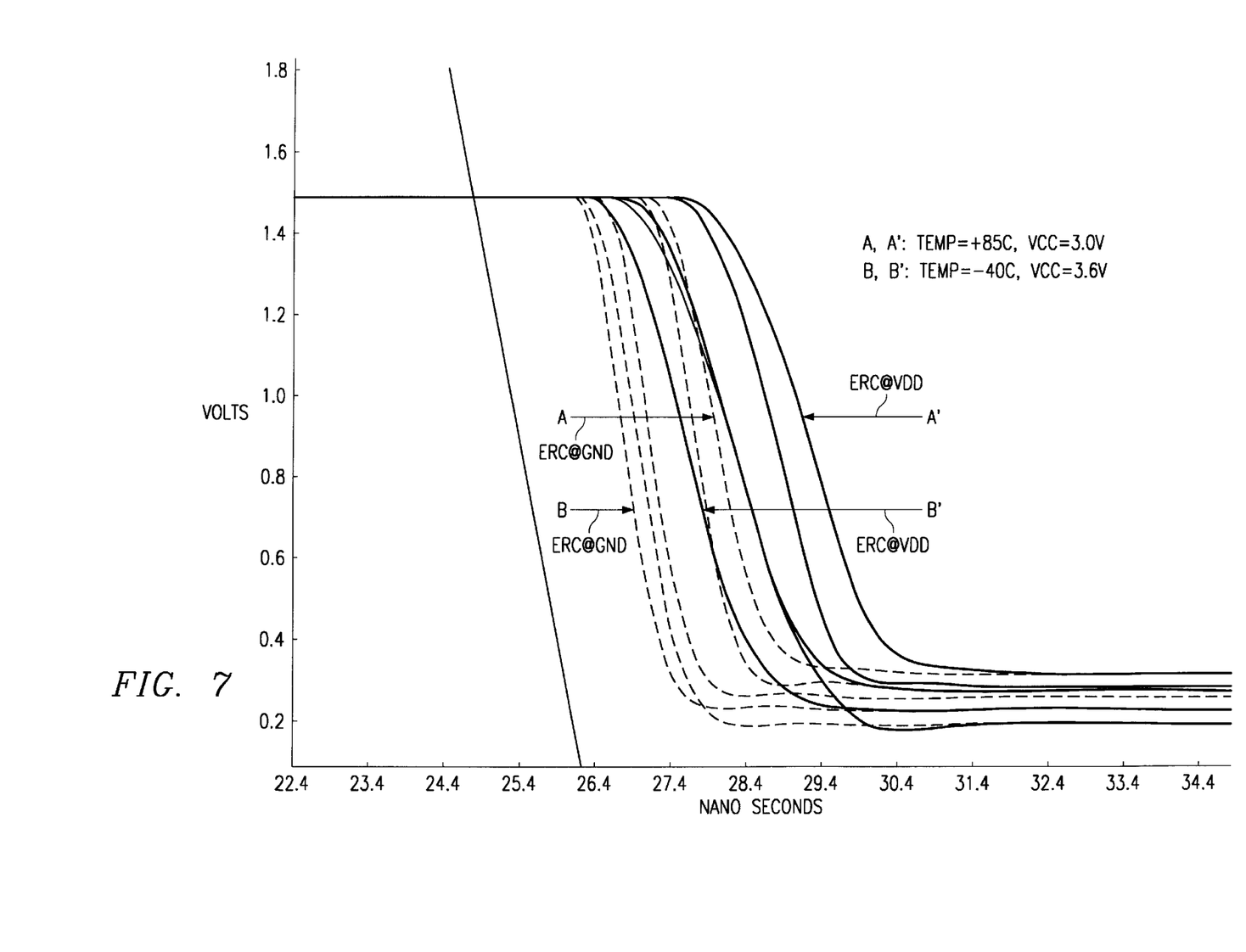
FIG. 7 shows comparative transceiver output data waveform fall times when the external pin is connected to ground and VDD.

FIG. 7 shows comparative fall times for the waveform of signal output data 6 for the same operating conditions as cited for FIG. 6, and likewise for signal edge rate control 7 selected to be at ground potential and VDD.

The range of edge rate control achievable with this invention is 0.8 to 1.3 nanoseconds/volt with signal edge rate control selected to be at ground potential, and 1.4 to 2.1 nanoseconds/volt with signal edge rate control selected to be equal to VDD, for the application of its use in a backplane bus transceiver as described herein.

Figure 8:
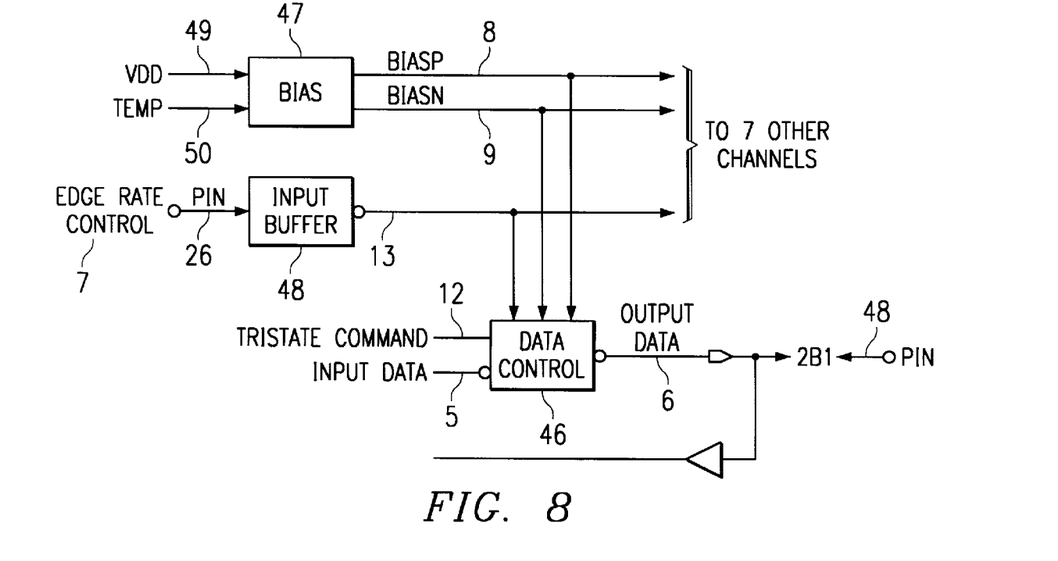
FIG. 8 is a partial logic diagram of the bus transceiver device showing how the invention is embodied.

FIG. 8 is a partial logic diagram for the Texas Instruments SN54GTL1655/SN74GTL1655 device which is a 16 bit low level TTL to GTL universal bus transceiver. This figure depicts an embodiment of the invention as an example application for the purpose of achieving output waveform edge rate control.

Referring to FIG. 8, data control block 46 is comprised of those parts of the invention shown in FIG. 1 as output data pre-driver 1, output data driver 4, and edge rate control driver 3. As can be seen in FIG. 8 data control block 46 has the following signals associated with it: input data 5, tristate command 12, signal line 13, biasp 8, biasn 9, and output data 6. These signals correspond also to those shown in FIG. 1. Each of the eight channels in the universal bus transceiver device contain the data control block function.

Bias block 47 of FIG. 8 is part of the universal bus transceiver and contains the necessary circuitry to generate signals-biasp 8 and biasn 9 dependent upon input signals VDD 49 and temp 50. As described previously signals biasp 8 and biasn 9 will vary in accordance with variations in supply voltage VDD and backplane temperature; these signals are also supplied to each data control block in the universal bus transceiver device. Bias block 47 is not part of the invention.

Input buffer block 48 is comprised of input buffer 2 shown in FIG. 1 with added buffer components that permit connection of the device external pin 26 to VCC in lieu of VDD as signal edge rate control 7. As stated previously, the external pin may also be connected to ground potential as determined by the user. Signal line 13 is likewise supplied to each data control block in the universal bus transceiver device.

The remainder of the logic diagram of FIG. 8 will not be described since it is not part of the invention and serves only to illustrate a typical embodiment.

Although the present invention has been described in detail, it should be understood that various changes, substitutions and alterations can be made without departing from the spirit and scope of the invention as defined by the appended claims. It is therefore intended that the appended claims encompass any such modifications or embodiments.

What is claimed is:

1. An edge rate controller circuit for controlling an output driver comprising:
   a first transistor coupled to an output control node of said output driver and having a control terminal coupled to receive an input signal;
   a second transistor coupled to the output control node and having a control terminal coupled to receive said input signal;

a third transistor coupled to the first transistor;

a fourth transistor coupled in parallel with the third transistor;

a first transmission gate coupled between a control terminal of the third transistor and a control terminal of the fourth transistor for providing an edge rate control signal;

a fifth transistor coupled to the second transistor;

a sixth transistor coupled in parallel with the fifth transistor; and a second transmission gate coupled between a control terminal of the fifth transistor and a control terminal of the sixth transistor for providing said edge rate control signal.

2. The circuit of claim 1 wherein said output driver comprises:

a seventh transistor having a control terminal coupled to the output control node; and a resistor coupled between the seventh transistor and an output data terminal.

3. The circuit of claim 1 wherein the first, third, and fourth transistors are PMOS transistors, and the second, fifth, and sixth transistors are NMOS transistors.

4. The circuit of claim 1 further comprising an input buffer coupled to a control terminal of the first transmission gate and a control terminal of the second transmission gate.

5. The circuit of claim 1 further comprising an output data pre-driver circuit coupled to a control node of the first transistor and a control node of the second transistor.

* * * * *